United States Patent [19]
Alivisatos et al.

[11] Patent Number: 5,751,018
[45] Date of Patent: May 12, 1998

[54] SEMICONDUCTOR NANOCRYSTALS COVALENTLY BOUND TO SOLID INORGANIC SURFACES USING SELF-ASSEMBLED MONOLAYERS

[75] Inventors: A. Paul Alivisatos; Vicki L. Colvin, both of Berkeley, Calif.

[73] Assignee: The Regents of the University of CAlifornia, Oakland, Calif.

[21] Appl. No.: 235,265

[22] Filed: Apr. 29, 1994

Related U.S. Application Data

[63] Continuation of Ser. No. 796,245, Nov. 22, 1991, abandoned.

[51] Int. Cl.$^6$ ................................................. H01L 29/04
[52] U.S. Cl. ............................ 257/64; 257/614; 257/642
[58] Field of Search ........................... 148/33.4, 225, 148/228, 233; 257/40, 642, 64, 200, 614

[56] References Cited

U.S. PATENT DOCUMENTS

| | | | |
|---|---|---|---|
| 4,802,951 | 2/1989 | Clark et al. | 156/630 |
| 5,505,928 | 4/1996 | Alivisatos et al. | 423/299 |

OTHER PUBLICATIONS

Whitesides, *Chimia* (1990) 44:310–311.
Nuzzo et al., *J. Amer. Chem. Soc.* (1983) 105(13):4481–4483.
Porter et al., *J. Amer. Chem. Soc.* (1987) 109(12):3559–3568.
Tillman et al., *Langmuir* (1989) 5(4):1020–1026.
Reubinstein et al., *Nature* (1988) 332:426–429.
Allara et al., *Langmuir* (1985) 1:45–52.
Maoz et al., *Langmuir* (1987) 3(6):1045–1051.
Maoz et al., *Langmuir* (1987) 3(6):1034–1044.
Wasserman et al., *Langmuir* (1989) 5:1074–1087.
Hickman et al., *J. Amer. Chem. Soc.* (1989) 111(18):7271–7272.
Lee et al., *J. Phys. Chem.* (1988) 92(9):2597–2601.
Bain et al., *J. Amer. Chem. Soc.* (1989) 111(8):7155–7164.
Pale-Grosdemange et al., *J. Amer. Chem. Soc.* (1991) 113(1):12–20.
Ulman et al., *Langmuir* (1989) 5(6):1418–1420.
Putvinski et al., *Langmuir* (1990) 6(10):1567–1571.
Tillman et al., *Langmuir* (1989) 5:101–105.
Chidsey, *Science* (1991) 251:919–922.
Chidsey et al., *J. Amer. Chem. Soc.* (1990) 112(11):4301–4306.
Chidsey et al., *Langmuir* (1990) 6(3):682–691.
Alivisatos et al., *J. Chem. Phys.* (1988) 89(7):4001–4011.
Spanhel et al., *J. Amer. Chem. Soc.* (1987) 109:5649–5655.
Hasse et al., *J. Phys. Chem.* (1988) 92:482–487.
Brus, *J. Chem. Phys.* (1984) 80:4403–4409.
Brus, *J. Phys. Chem.* (1986) 90(12):2555–2560.
Bawendi et al., *J. Chem. Phys.* (1989) 91:7282–7290.
Alivisatos et al., *J. Chem. Phys.* (1988) 89(10):5979–5982.
Ekimov et al., *Journal of Luminescence* (1990) 46:97–100.
Liu et al., *J. Appl. Phys.* (1990) 68(1):28–32.
Zen et al., *Langmuir* (1989) 5:1355–1358.
Steigerwald et al., *J. Amer. Chem. Soc.* (1988) 110(10):3046–3050.

(List continued on next page.)

*Primary Examiner*—Sara W. Crane
*Assistant Examiner*—Courtney A. Bowers
*Attorney, Agent, or Firm*—Pepi Ross; Paul R. Martin

[57] ABSTRACT

Methods are described for attaching semiconductor nanocrystals to solid inorganic surfaces, using self-assembled bifunctional organic monolayers as bridge compounds. Two different techniques are presented. One relies on the formation of self-assembled monolayers on these surfaces. When exposed to solutions of nanocrystals, these bridge compounds bind the crystals and anchor them to the surface. The second technique attaches nanocrystals already coated with bridge compounds to the surfaces. Analyses indicate the presence of quantum confined clusters on the surfaces at the nanolayer level. These materials allow electron spectroscopies to be completed on condensed phase clusters, and represent a first step towards synthesis of an organized assembly of clusters. These new products are also disclosed.

41 Claims, 5 Drawing Sheets

OTHER PUBLICATIONS

Bain et al., *J. Amer. Chem. Soc.* (1989) 111(1):321–335.
Bain et al., *Langmuir* (1989) 5(3):723–727.
Strong et al., *Langmuir* (1988) 4(3):546–558.
Ulman et al., *Langmuir* (1989) 5(5):1147–1152.
Allara et al., *Langmuir* (1985) 1(1):52–66.
Bain et al., *J. Amer. Chem. Soc.* (1989) 111(18):7164–7175.
Goss et al., Department of Chemistry, University of California, Berkeley, prepublication copy entitled, "Application of 3–Mercaptopropyltrimethoxysilane as a molecular adhesive in the fabrication of vapor–deposited gold electrodes on glass substrates" pp. 1–17.
Nuzzo et al., *J. Amer. Chem. Soc.* (1987) 109(8):2358–2368.
Wasserman et al., *J. Amer. Chem. Soc.* (1989) 111(15):5852–5861.
Zhao et al., *Chem. Mater.* (1991) 3(1):168–174.
Goldstein et al., "Melting in semiconductor nanocrystals", *Science* (1992) 256:1425–1427.
Colvin et al., "Semiconductor nanocrystals covalently bound to metal surfaces with self–assembled monolayers", *Amer. Chem. Soc.* (1992) 114(13):5221–5230.
Zhao, Semiconductor Particulate Films on Solid Supports, Chem. Mat., 1991, 3, pp. 168–174.
Zhao, Size Quantitization in Semiconductor Particulate Films, J. Phys. Chem. 1991, 95, pp. 3716–3723.
Yuan, Preparation of ultrathin.–size–quantized semiconductor particulate films at oriented mono–and poly, Chem. Mat., 2(3), 226–229.
Tillman, Form. of Multilayers by Self–Assembly, Langmuir, 1989, 5, pp. 101–111.
Steigerwald, Surface Deriv. and Isol. of Semicond. Cluster Molecules, J. Am. Chem.. Soc., 1988, 110, pp. 3046–3050.

SEMICONDUCTOR NANOCRYSTALS COVALENTLY BOUND TO SOLID INORGANIC SURFACES USING SELF-ASSEMBLED MONOLAYERS

This is a continuation of application Ser. No. 07/796,245 filed on Nov. 22, 1991, now abandoned.

REFERENCE TO GOVERNMENT SUPPORT

This invention was made with Government support under Contract No. DE-AC03-76SF00098 between the United States Department of Energy and the University of California for the operation of Lawrence Berkeley Laboratory. The Government has certain rights to this invention.

BACKGROUND OF THE INVENTION

1. Field of the Invention

This invention is in the field of semiconductor fabrication techniques. More particularly it involves the binding of semiconductor nanocrystals to solid inorganic surfaces.

2. Background Information

The ability to assemble molecules into well-defined two- and three-dimensional spatial configurations is a major goal in the field of self assembled monolayers (SAMs), Whitesides, G. M., *Chimia* (1990) 44: 310–311. Since the discovery that alkane thiols will displace practically any impurity on a gold surface, Nuzzo, R. G. et al., *J. Am. Chem. Soc.* (1983) 105: 4481–4483, and will spontaneously create an ordered monolayer of high quality, Porter, M.D. et al., *J. Am. Chem. Soc.* (1987) 109, 3559–3568, interest in these systems has been extensive, Tillman, N. et al., *Langmuir* (1989) 5: 1020–1026, Reubinstein, I. et al., *Nature* (1988) 332: 426–429, Bravo, B. G. et al., *Langmuir* (1989) 5: 1092–1095. Recent advances have extended SAMs beyond the prototype gold/thiol systems. Fatty acids on aluminum, Allara, D. L. et al., *Lancmuir* (1985) 1: 45–52; silanes on silicon, (a) Maoz, R. et al., *Lancmuir* (1986) 3: 1045–1051, (b) Maoz, R. et al, *Lancmuir* (1987) 3: 1034–1044, (c) Wasserman, S. R. et al., *Lancmuir* (1989) 5: 1074–1087; isonitriles on platinum, Hickman, J. M. et al., *J. Am. Chem. Soc.* (1989) 111: 7271–7272; and rigid phosphates on metals, Lee, H. et al., *J. Phys. Chem.* (1988) 92: 2597–2601 are examples. In addition to the wide choice of the substrate, the chemical functionality presented at the top of a monolayer can be controlled by replacing monofunctional alkanes with difunctional organic compounds, (a) Bain, C. D. et al., *J. Am. Chem. Soc.* (1989) 111: 7155–7164, (b) Pale-Grosdemange, C. et al., *J. Am. Chem. Soc.* (1991) 113: 12–20. Such assemblies can then be used to build up more complex structures in three dimensions, (a) Ulman, A. et al., *Langmuir* (1989) 5: 1418–1420 (b) Tillman, N. et al., *Langmuir* (1989) 5: 101–105, enabling chemists to engineer complex organic structures on top of macroscopic surfaces. This specific control over the microscopic details of interfaces has allowed for diverse applications of SAMs. Metals, for example, provide the ideal support for organic compounds with large non-linear optical behavior, and by using SAMs the molecules can be held in specific orientations with respect to the metal, Putvinski, T. M. et al., *Langmuir* (1990) 6: 1567–1571. In other work, the ability to dictate the structural details of an interface is exploited to study processes of electron transport between an electrode surface and an active moiety bound on top of a monolayer (a) Chidsey, C. E. D.; *Science* (1991) 251: 919–922, (b) Chidsey, C. E. D. et al., *J. Am. Chem. Soc.* (1990) 112: 4301–4306, (c) Chidsey, C. E. D. et Semiconductor nanocrystals have been the subject of numerous spectroscopic investigations in recent years, Alivisatos, A. P. et al., *J. Chem. Phys* (1988) 89: 4001–4011, (a) Spanhel, L. et al, *J. Am. Chem. Soc.* (1987) 109: 5649–5655, (b) Hasse, M. et al., *J. Phys. Chem.* (1988) 92: 482–487, the origin of the extensive interest is that the absorption spectrum of the clusters is a strong function of their radii, Brus, L. E., *J. Chem. Phys.* (1984) 80: 4403–4409. The clusters, in that work were cadmium sulfide, range in size from 10 to 100 Å radius, and as their radius decreases the electronic wave functions are confined, causing the absorption edge to shift to the blue by as much as one volt, Brus, L. E., *J. Phys. Chem.* (1986) 90: 2555–2560. Despite these dramatic changes in electronic structure, only optical spectroscopies have been used to study these systems. Other experiments have not yet been performed because of limitations in the ability to control the environment of the clusters. Currently the nanocrystals can be isolated as powders for x-ray diffraction work. Bawendi, M. G. et al., *J. Chem. Phys.* (1989) 91: 7282–7290, solubilized in methanol for high pressure studies, (a) Alvisatos, A. P. et al. *J. Chem. Phys.* (1988) 89: 5979–5982; (b) Hasse, M. et al. "*Clusters and Cluster Assembled Materials*"MRS Symposium Proceedings, R. S. Averback, D. L. Nelson and J. Bernholc, editors MRS Press (Pittsburgh) (1991), placed in inorganic glasses or polymers for optical experiments, Ekimov, A. I. et al. *Journal of Luminescence* (1990) 46: 97–100, Liu, Li-Chi et al. *J. Appl. Phys.* (1990) 68: 28–32, and deposited by evaporation on graphite for STM imaging, Zen, Jyh-Myng et al. *Lanamuir* (1989) 5: 1355–1358. A serious problem with all of these media is that they do not allow the clusters to dissipate charge. As a result, traditional probes of electronic structure, such as valence band photoemission, have proved impossible to perform on nanocrystals.

STATEMENT OF THE INVENTION

It has now been found that semiconductor nanocrystals, also referred to herein as clusters, can be covalently bound to solid inorganic surfaces such as metals, oxides, or the like using self-assembled monolayers as a bridge. The invention takes advantage of the extensive developments in SAMs to tailor the distance between the cluster and the substrate surface, and the chemical and physical properties of the substrate and bridging moiety to meet spectroscopic requirements. By providing an avenue for charge dissipation, these samples on metal substrates enable electron spectroscopies of the density of states to be performed on nanocrystals for the first time. In addition, binding of the clusters to surfaces finds application in Raman and resonance Raman scattering experiments on nanocrystals which ordinarily fluoresce strongly, in low temperature spectroscopy of clusters, in far ultraviolet absorption spectroscopy to ascertain the highly excited electronic states of these systems, and in electrochemical studies. Since the nanocrystals can now be deposited in an asymmetric environment, intact, but in close proximity to each other, the total assembly can have collective properties of considerable interest.

The invention employs the well-developed chemistry of SAMs to attach semiconductor nanocrystals to metal surfaces. The incorporation of clusters into the monolayers is the first step towards creating arrays of quantum dots, and the total assembly of clusters on metals represents a new kind of material with many potential uses. There is immediate application of this new assembly in the study of the electronic behavior of the quantum dots.

In one aspect, this invention provides a method for forming a monolayer of semiconductor nanocrystals on an inorganic (e.g., metal) surface. This method involves covalently bonding the nanocrystals to the surface using an organic bridging moiety. In one embodiment the bridging moiety is first bound to the metal surface and then bound to the nanocrystals. In a second embodiment the bridging moiety is first bound to the nanocrystals and then bound to the surface.

In another aspect, this invention provides the semiconductor materials which include a surface with a monolayer of semiconductor nanocrystals covalently affixed.

DETAILED DESCRIPTION OF THE INVENTION

DESCRIPTION OF PREFERRED EMBODIMENTS

Figure 1A:
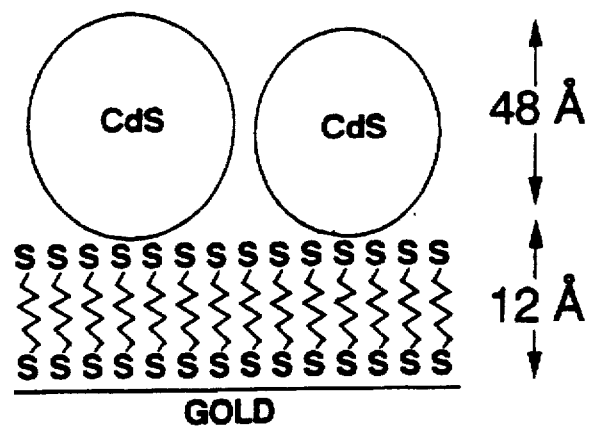
FIG. 1 contains schematic illustrations of cadmium sulfide nanocrystals bound to solid inorganic surfaces. A) Cadmium sulfide from inverse micelles bound to gold via 1,6-hexane dithiol. B) Cadmium sulfide nanocrystals synthesized in water and coated with carboxylates bound to aluminum. C) Cadmium sulfide from inverse micelles bound to aluminum via a thioglycolic acid.

This section is divided into the following subsections.
The Semiconductor Nanocrystals and their Preparation
The Inorganic Surfaces
The Bridging Moieties
Preparation Process and Conditions
The Semiconductor Nanocrystals and their Preparation This invention provides a method for bonding nanocrystals of semiconducting compounds to inorganic surfaces. It finds application with III–V compounds such as GaAs, GaP, GaAs-P, GaSb, InAs, InP, InSb, AlAs, AlP, and AlSb; and with II–VI compounds such as CdS, CdSe, CdTe, HgS, ZnS, ZnSe and ZnTe. These compounds and their applications in solid state electronic devices are well known.

The above-described semiconducting compounds are employed as nanocrystals. A nanocrystal is defined to be a crystallite having dimensions in the nanometer range, that is, of less than 100 Å (10 nm).

While materials throughout this size range will work, as a general rule, materials having dimensions in the 1 to 6 nm range are preferred, and especially 1 to 5 nm.

These materials in their nanocrystalline form can be formed by various techniques designed to prevent macrocrystal formation.

In a copending U.S. patent application USSN (Docket IB-868), filed on even date with this application by P. Alivisatos and M. Olshavsky and incorporated by reference, together with their earlier publication (with A.N. Goldstein) appearing at J.A.C.S. (1990) 112: 9438 (Dec., 1990), a process for forming nanocrystals of III–V compounds such as GaAs is set forth.

In this process, a group III metal source, such as a GaIII salt, InIII salt, or AlIII salt or corresponding metal 1–6 carbon trialkyls, is reacted directly with an arsenic, phosphorus, or antimony source such as arsine, phosphine, or stibine, an alkyl arsine, phosphine or stibine, or an alkyl silyl arsine phosphine or stibine in liquid phase at an elevated temperature. Representative metal sources include $GaCl_3$, $GaBr_3$, $GaI_3$, $InCl_3$, $InBr_3$, $AlCl_3$, $Ga(Me)_3$, $Ga(Et)_3$, $Ga(Bu)_3$, or the like. Representative arsenic, phosphorus and selinium sources include $AsH_3$, $PH_3$, $SeH_3$, $AsH_2(1-6$ carbon alkyl), $As(1-4$ carbon alkyl$)_3$, $P(1-4$ carbon alkyl$)_3$, $As(Si(1-6$ carbon alkyl$)_3)_3$, $P(Si(1-6$ carbon alkyl$)_3)_3$, $Se(Si(1-4$ carbon alkyl$)_3)_3$ and the like.

One of each of these two groups of materials are mixed together in a nonaqueous liquid reaction medium which includes a crystal growth terminator and heated to a temperature of at least about 100° C. for a prolonged period of at least about 1 hour. Polar organics, such as nitrogen- and phosphorus-containing organics, can serve as crystal growth terminators. Water and air should be excluded from the reaction zone. This causes the desired nanocrystals to form. The reaction medium can then be removed to yield the nanocrystals in dry form.

II–VI materials such as CdS can be formed as nanocrystals using colloidal precipitation techniques. In one technique, a group II metal source such as a CdII salt, an HgII salt or a ZnII salt is dissolved in water and this solution suspended in an organic liquid such as hexane, heptane or octane or the like with a colloid former such as deoctylsulfosuccinate. A suitable group IV counterion (sulfide, selenide or telluride) source is dissolved in water and similarly suspended in an organic liquid. These two suspensions are mixed to yield a colloidal suspension of nanocrystals of the semiconductor compound. This suspension is destabilized by addition of a capping group, for example a thioacid such as thiophenol or mercaptoacetic acid. This causes the nanocrystals to precipitate for recovery.

Typical metal sources include cadmium II sources, for example salts and dialkyls, such as $CdCl_2$, $Br_2$ or $I_2$, $Cd(ClO_4)_2$, $Cd(1-6$ carbon alkyl$)_2$, as well as mercury II and zinc II equivalents. Counterions can be provided by simple salts such as alkali metal sulfides, selenides or tellurides, $Na_2S$, $K_2S$, $Na_2Se$, $K_2Se$, $Na_2Te$ and $K_2Te$. This general method for forming nanocrystals is referred to as a "reverse micelle" method and is described in more detail in M.L. Steigerwald et al., J. Am. Chem. Soc. 110: 3046 (1988), which is incorporated herein by reference.

Other colloidal precipitation methods will work as well. For example, one can precipitate the II–VI materials out of acidic or basic media in the presence of capping agents such as mercaptoacetate ions, in the form of colloidal nanocrystals.

These methods are representative, and other methods which provide nanocrystals of these materials can be used as well.

The Inorganic Solid Surfaces

The surface upon which the nanocrystals are deposited can be a metal or a nonmetallic inorganic materials such as metal oxide, metal sulfide, carbide, or the like. Nonmetals can be insulators such as silicon oxides, aluminum oxides, boron oxides, titanium oxides and the like. They also can be semiconductors.

Metal surfaces can be made of any metal or alloy. Often the metal is chosen for its electrical conductivity properties. Metals such as gold, silver, copper, aluminum, gallium, and the like can be used. Gold and aluminum are preferred metals.

The nonmetal or metal surface can be a bulk surface or it can be a thin layer. Thin layers of metals or metal oxides or sulfides may be sputtered or plated or vapor-deposited upon a substrate.

Best results are achieved when the surface is very clean. To this end, the surface can be plasma etched, acid etched and the like prior to coupling the semiconductor nanocrystals to it.

The Bridging Moieties

The nanocrystals are covalently attached to the surface through a bridging moiety which bonds to a metal atom in the inorganic surface and to the nanocrystal. These materials can be homobifunctional—that is, presenting two identical groups which can bond to the inorganic surface and to the nanocrystal. They also can be heterobifunctional—that is, presenting one each of two groups. One of the groups is capable of bonding to the crystals and one bonds to the inorganic surface.

Thiol groups are capable of bonding to metal surfaces. They also can bind to the nanocrystals. This gives rise to one family of binding moieties—dithiols. These materials have the structure H—S—R—S—H, where R is an organic group, particularly a hydrocarbyl organic having a distance of from about 8 to about 5 and especially about 7 to about 4 carbons between the two S's. These materials include 1,4-dithiol n-butane, 1,4-dithiol cyclohexane, 1,5-dithiol n-pentane and 1,6-dithiol n-hexane. Dithiol compounds having side chains and the like can be used. It appears that materials in the 4–6 carbon spacer class give good results because spatially there is less tendency for the spacer to loop and allow both ends of a single chain to both bond to the surface or to the nanocrystals.

The dithiol can be attached to the metal first or to the nanocrystal first.

Another family of materials are those which present a thiol and a carboxyl. The carboxyl is capable of binding to a metal in the surface and the thiol of binding to the nanocrystal. Examples of these materials are mercaptoacetic acid, mercaptopropionic acid, 4-mercapto,1-carboxyl cyclohexane, and the like.

Preparation Process and Conditions

The process of preparation involves coupling the nanocrystals to the surface though the bridging moieties.

In one approach, the metal surfaces, scrupulously cleaned, are contacted with a solution of the bridging moiety. This can be carried out at room temperature for from about 15 minutes to about 24 hours or more. An excess of bridging moiety is used. The excess is rinsed away. Thereafter, the nanocrystal clusters are contacted with the bridging moiety-rich surface for from about an hour to as long as 48 hours or more to effect coupling. Again, good results are achieved at room temperature and higher.

Similar times (1 to 48 hours) and temperatures (10° to 50° C.) give good results with the other coupling chemistries as well.

Figure 1B:
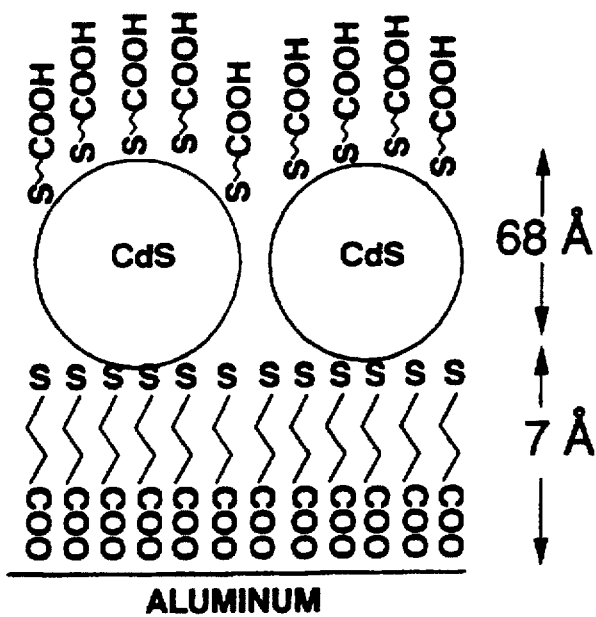

This invention will be further described by the following examples. In them the preparation of monolayers of semiconductor nanocrystals covalently bound to inorganic surfaces is described. One technique involves building a self-assembled monolayer using alkane dithiol compounds. In comparison to other work which involved using thiols as coupling agents to gold, relatively short chain alkanes are used to avoid the problem of looping. The monolayers thus formed are stable enough to withstand further chemistry on the available thiol groups. When these thiol-rich surfaces are exposed to metal-containing nanocrystals, the sulfurs form strong bonds to the metal-containing nanocrystals, anchoring the clusters to the surface (FIG. 1A). An additional method involves binding the bridging group to the clusters first, and then exposing the solution to the free metal (FIGS. 1B, C). Both techniques result in durable films of dispersed clusters, homogeneous on a μm scale with approximately 0.5 monolayer coverage.

These examples are not to be construed as limiting the scope of the invention which is defined by the appended claims. These examples include a substantial discussion of the properties of the products of the invention to aid in the understanding of their application in semiconductor fabrication settings.

EXAMPLE 1

Preparation of Semiconductor Nanocrystals by Inverse Micelle Method:

Cadmium sulfide clusters were prepared in inverse micelles following methods developed by Steigerwald, M.L. et al., *J. Am. Chem. Soc.* (1988) 110: 3046–3050, and Lianos, P. et al., *Chem. Phys. Lett.* (1986) 125: 299–302. Two separate solutions of 500 ml spectrographic grade heptane and 44.4 grams of dioctyl sulfosuccinate [577-11-7], AOT, were prepared under nitrogen. 2.34 grams of $Cd(Clo_4)_2 \cdot 6H_2O$ dissolved in 12.0 ml of deoxygenated, deionized water were added to one solution, while 0.36 grams of $Na_2S \cdot 9H_2O$ dissolved in 12.0 ml of deoxygenated, deionized water were added to the other solution. Both solutions appeared clear and colorless after one hour of mixing. The cadmium solution was then transferred to the sulfide via a 12-gauge double transfer needle. The transfer process took 15 minutes and resulted in the formation of a clear yellow solution. At this point, 500 ml of this solution was reserved for later use, and the rest was treated with 0.45 mg of thiophenol, which binds to the surface of the clusters causing them to come out of the micelles. The resulting powder was vacuum filtered three times and rinsed with 300 ml petroleum ether. It was redissolved in 10 ml pyridine and filtered again. The powder was heated, reprecipitated into 200 ml of petroleum ether, and filtered again. This sample was then refluxed in 20 ml of quinoline at 240° C. for 3 hours. Reprecipitation and filtering followed this, leaving a finely divided yellow powder redissolvable in pyridine.

EXAMPLE 2

Preparation of Cadmium Sulfide

Nanocrystal Clusters from an Acidic Colloid

A 500 ml solution of $1\times10^{-3}M$ $CdCl_2$ was prepared, and to this was added a 500 ml solution of $1.6 \times 10^{-3}M$ sodium mercaptoacetate, resulting in a turbid blue solution. The pH was lowered to 3.35 with HCl, producing a colorless solution. 150 ml of $1\times10^{-2}M$ $Na_2S$ was then injected to the quickly stirring solution. This preparation gave nanocrystals with an absorption maximum at 460 nm. Crystallites with absorption maxima as low as 360 nm could be obtained by reducing concentrations.

EXAMPLE 3

Preparation of Cadmium Sulfide Nanocrystal Clusters from a Basic Colloid

One liter of $1\times10^{-3}$M $CdCl_2$ was titrated with mercaptoacetic acid to pH 2.8, resulting in a turbid blue solution, as above. Concentrated NaOH was then added dropwise until the pH was greater than 8.5 and the solution was again colorless. While the solution was quickly stirred, 110 ml of $1\times10^{-2}$M $Na_2$S was added. Nanocrystal particle sizes with absorption maxima between 360 nm and 410 nm were produced by varying the final pH of the thiol titration.

The colloids from Examples 2 and 3 were reduced by rotary evaporation to a redissolvable powder which contained NaCl as a reaction byproduct. Dialysis against a dilute solution of mercaptoacetic acid was used to remove the salt while maintaining the solubility of the colloids. Solutions of redissolved crystallites were stable in the dark for months. All reactions were conducted in room light using deionized, distilled water. The colloids can be grown by heating to 90° C. in the presence of 0.5 ml of the thiol.

EXAMPLE 4

The preparations of Examples 1-3 are repeated varying the starting materials. In place of $Cd(ClO_4)_2 \cdot 6H_2O$ and $CdCl_2$, $ZnCl_2$ can be used, leading to ZnS nanocrystals.

EXAMPLE 5

The preparations of Examples 1-3 are repeated varying the starting materials. In place of $Na_2S$, $Na_2Se$ is used, leading to CdSe nanocrystals.

EXAMPLE 6

$GaC_3$ (99.99%) was purchased from Aldrich, purified by sublimation, and stored in a dry box. Tris(trimethylsilyl)arsine was prepared according to literature methods, Becker, G. et al., *Anorg. Allg. Chem.* (1980) 462: 113, purified by vacuum distillation, and stored in a dry box at 0° C. Proton NMR and infrared spectra matched the literature values. Tris(trimethylsilyl)arsine: IR (neat liquid) 2892 (m), 2890 (s), 2828 (s), 2816 (s), 2785 (vs), 1446 (s), 1400 (vs), 1306 (s), 1259 (vs), 1240 (w), 1124 (m), 869 (w), $^1$H NMR (300 MHz, $C_6D_6$) δ0.35 (s, $SiMe_3$). Quinoline was purchased from Aldrich and distilled immediately prior to use. Quinoline (25 mL) containing $6.5\times10_{-3}$ mol of tris(trimethylsilyl)arsine was added to $6.5\times10_{-3}$ mol of $GaCl_3$ in 25 mL of quinoline. The resulting mixture was heated at reflux (240° C.) for 3 days. A red powder was isolated by removal of the solvent, and the powder consisted of GaAs particles which are redissolvable in pyridine or quinoline.

The quinoline-soluble GaAs particles were studied by TEM. TEM revealed prolate GaAs particles with an average major axis of 45 Å and minor axes of 35 Å.

EXAMPLE 7

The preparation of Example 6 is repeated using a corresponding phosphine, tris(trimethylsilyl)phosphine, in place of the arsine of Example 6. This leads to GaP nanocrystals as the product.

EXAMPLE 8

The preparation of Example 6 is repeated using $InCl_3$ as a starting material in place of $GaCl_3$. This leads to InAs nanocrystals as the product.

EXAMPLE 9

Preparation of Metal Substrates

Some of the metal layers used in these experiments were prepared by vapor deposition of gold or aluminum onto glass slides. The vapor deposition was performed at $10^{-7}$ torr in a bell jar; evaporations usually took 10 min and resulted in films with an average thickness of 1000 Å. The thickness was determined by a quartz crystal microbalance inside the bell jar. Adhesion of the gold films to the glass slide was insured by use of a "molecular glue," 3-mercaptopropyltrimethoxysilane. Reproducible high-quality films were obtained when the glass slides were cleaned prior to treatment by immersion in 1:4 reagent grade 30% $H_2O_2$/conc. $H_2SO_4$ (cleaning solution) at 70° C. for 10 min. This cleaning solution reacts violently with many organic materials and should be handled with extreme care.

In addition to the metal evaporated films, metal blocks were also used as substrates to facilitate mounting of the samples to spectrometers and cryostats. For aluminum samples, solid aluminum was machined into an appropriate size with a satin finish. For a gold substrate, a micron-thick layer of gold was electroplated onto aluminum blocks; in this procedure significant etching of the aluminum produced a much smoother surface with a mirror finish. These block samples, although ideal for low temperature applications and photoemission, were more rough, and coverages for some of the samples, especially the water-soluble CdS clusters on aluminum, were lower.

Preparation of Nonmetallic Substrates

Nonmetal substrates, such as silicon oxide or aluminum oxide, can also be used. These materials should present a scrupulously clean surface as well, which can be achieved by chemical cleaning as set forth above in this example, or by physical cleaning such as by plasma etching the surface or the like.

EXAMPLE 10

Preparation of Dithiol Monolayers on Gold

Self-assembled monolayers were prepared by immersing gold substrates in dilute solutions of hexane dithiol following established methods (Bain, C.D. et al., *J. Am. Chem. Soc.* (1989) 111: 321-335 and 111: 7155-7164, and Pale-Grosdemange, C. et al., *J. Am. Chem. Soc.* (1991) 113: 12-20). Gold substrates were plasma-etched before use with an etching time of 10 minutes at 200 mtorr in $N_2$ atmosphere. Contact angles after such etching were less than 10°, indicating clean surfaces. The samples were placed in 5 mM ethanolic solutions of dithiol for 8 to 12 hrs. Gold substrates were coated with 1,6-hexane dithiol (FIG. 1A). After immersion, the samples were removed from solution, rinsed with ethanol for 30 seconds, and then blown dry with argon. Contact angle measurements were performed at this time.

EXAMPLE 11 and 12

Different lengths of dithiol were used with varying degrees of success. Propane dithiol monolayers on gold gave low contact angles and XPS showed little evidence of sulfur, while 1,8-octane dithiol on gold gave high contact angles and resulted in low nanocrystal coverages. All thiols were purchased from Aldrich; 1,6-hexanedithiol was 97% pure and mercaptoacetic acid was 95% pure. Under ambient conditions, the dithiols will interconvert to disulfides; a disulfide impurity has little impact on the films since thiol groups are hundredfold more efficient at binding to gold (Bain, C.D. et al., *Lancmuir* (1989) 5: 723–727).

EXAMPLE 13

Preparation of Thiol Monolayers on Aluminum: Aluminum was treated with mercaptoacetic acid to make its surface thiol rich (FIG. 1B) following methods developed by Nuzzo et al. (Allara, D.L. et al., *Langmuir* (1985) 1: 45–52). Although freshly evaporated aluminum has a low contact angle, plasma etching was performed on the substrates prior to immersion. Etched substrates were immediately placed in solutions of 5 mM mercaptoacetic acid dissolved in ethanol and were allowed to sit for 12 hours. The substrates were removed, rinsed with ethanol for 30 seconds and blown dry with argon. Samples could be stored in a desiccator prior to coating with nanocrystals.

EXAMPLE 14

Preparation of Cluster Monolayers: The aluminum and gold substrates were prepared such that their surfaces contained free thiols. These SAMs were then exposed to solutions of cadmium sulfide clusters in micelles. These solutions contained heptane, AOT, and clusters prepared in Example 1. Exposure was completed much in the same way as for the original monolayers: the sulfur-rich SAMs were immersed in solutions of heptane containing the inverse micelles. The heptane solutions were used undiluted, and hence had an approximate concentration of 2.70 grams of cadmium sulfide per liter. Typical immersion time was 12 hours, and afterwards the samples were rinsed with heptane for 30 seconds then blown dry with argon. The treatment afterwards was identical to the preparation of the SAMs. The films were indefinitely stable.

EXAMPLE 15

An additional method which bypasses the use of a preliminary monolayer was also developed. In this case, CdS nanocrystals prepared with carboxylate-rich surfaces in Examples 2 and 3 were exposed to freshly etched aluminum of Examples 9–13. The dialyzed powders of Examples 2 and 3 were dissolved in nanopure water with 18 M-Ohm resistivity in concentrations of 4 mg/ml. The aluminum substrates were immersed in the water solutions 24–48 hours. Treatment after immersion included a 30 second water rinse followed by drying with argon gas.

EXAMPLE 16

The procedures of Examples 14 and 15 are repeated with variations. In one variation, the CdS nanocrystals are replaced by GaAs nanocrystals of Example 6; by the CdSe nanocrystals of Example 5; and by the ZnS nanocrystals of Example 4.

In another variation, the metal substrate is replaced by the inorganic oxide substrate of Example 9.

These variations lead to monolayers of these different nanocrystals covalently attached to these various substrates.

Characterization of Products

The products of Examples 14 and 15 were characterized by contact angle measurements, transmission electron microscopy (TEM), x-ray photoemission, resonance Raman spectroscopy, Rutherford back-scattering (RBS) and ultraviolet photoemission.

Ultraviolet Visible Spectroscopy: Ultraviolet visible spectroscopy was performed on a Hewlett Packard 8405A Diode Array spectrometer. The resolution of the machine was 2 nm and typical optical densities at the peak of the first excitonic feature were 0.2 to 1. Cadmium sulfide nanocrystals were either dissolved in water or heptane. The size of the crystallites was determined using the relationship between the absorption peak of the first excited state of the crystallite and size, as calculated by the tight binding method of Lippens, P.E. et al., *Phys. Rev.* (B1989) 39:10935.

X-Ray Powder Diffraction: X-ray powder diffraction was performed on the isolated cadmium sulfide powders on a Siemens PDA 5000 diffractometer equipped with a Cu Ka tube and a scintillation counter. Instrument resolution (0.05° 2Θ) was far narrower than the observed peak widths. Typical integration times lasted 4 hrs.

Transmission Electron Microscopy and Electron Diffraction: Micrographs were obtained at the National Center for Electron Microscopy at the Lawrence Berkeley Laboratory, on a JEOL 200 CX microscope operating at 200 kV, and with spatial resolution of 2.2 Å. Clusters were deposited on plasma-etched amorphous carbon substrates supported on 600 mesh copper grids. Nanocrystals were deposited from solutions by evaporation of the solvent. Thin aluminum films (typically 200 Å thick) with colloids bound to them were floated free of a salt substrate and supported on a 600 mesh copper grid. Selected area electron diffraction patterns were recorded on film, and the negatives were digitized using a 2048 element CCD camera.

Contact Angle: Contact angle measurements were performed on a Rame-Hart model 100 contact angle goniometer using deionized water at ambient humidity. Advancing contact angles were measured three times at different places on the films.

Resonance Raman Spectroscopy: Resonance Raman was performed with a tunable dye laser as the excitation source from 4000 to 457 nm, and with lines from an argon ion laser for wavelengths between 457 nm and 514.5 nm. A SPEX triple monochromator with a final stage grating blazed at 500 nm and with 1800 grooves/mm was used to isolate the inelastically scattered light. A Photometrics liquid nitrogen cooled CCD camera with a PM 512 chip recorded the spectrum. The average spot size was on the order of 5 µm, and typical scans took 20 min with 5–20 mW incident power. Resonance Raman excitation profiles were obtained at ambient temperature. Cross-sections were determined relative to a quartz standard by sample substitution.

Rutherford Backscattering: RBS was performed on the films at the Lawrence Berkeley National Laboratory RBS facility.

Figure 2:
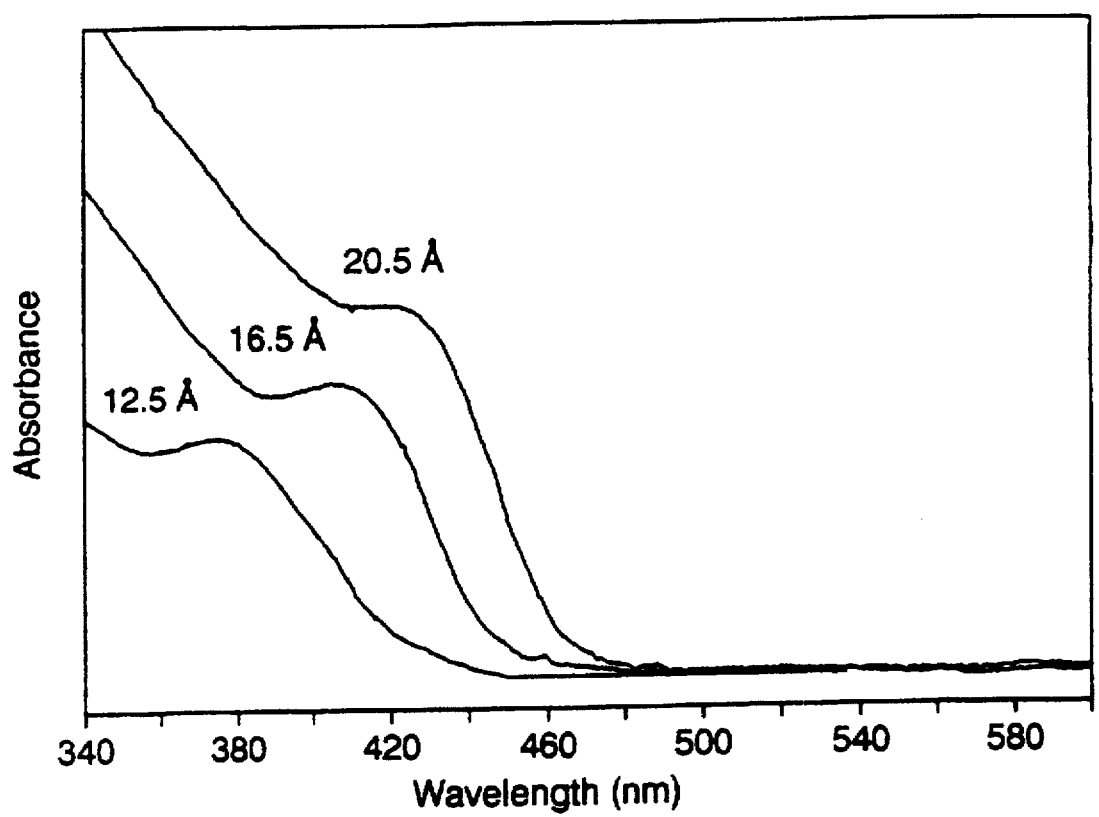
FIG. 2 illustrates ultraviolet visible spectra of CdS clusters in heptane/micelle mixtures. The radii listed were determined by the absorption maximum.
Figure 3A:
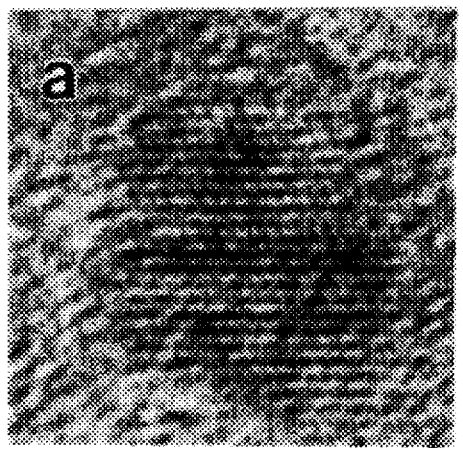
FIG. 3 illustrates TEM images of CdS clusters of different size which reveal lattice planes. The bar in panel D is 50 Å, and the magnification is the same in all four panels. A statistically large enough sample of such images provides a basis for sizing.
Figure 3B:
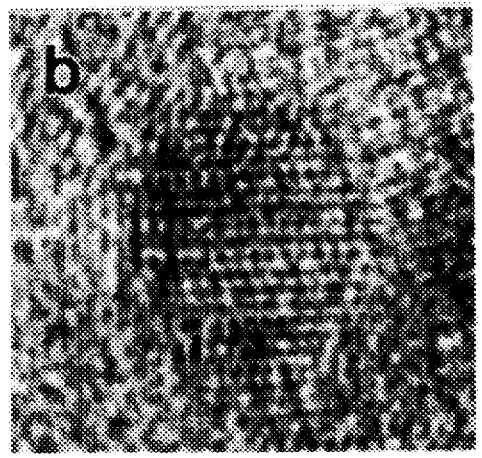
Figure 3C:
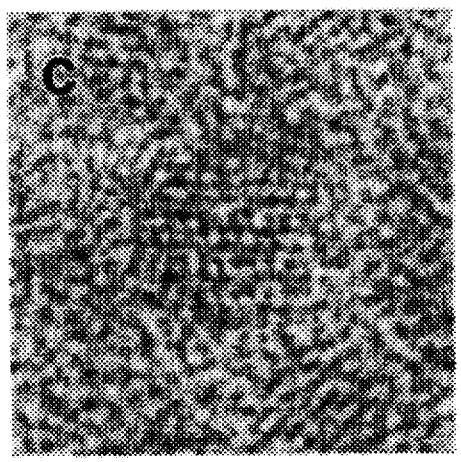
Figure 3D:
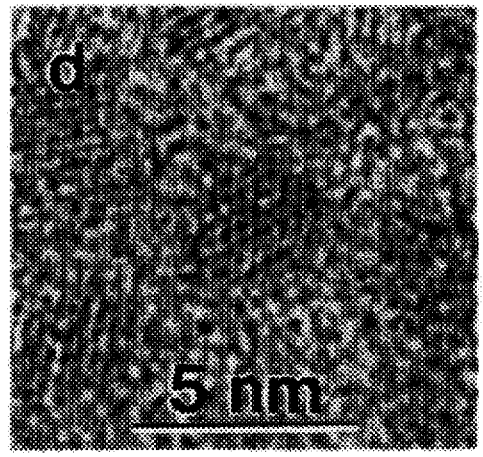

Characterization of Clusters Before Deposition: Solution phase studies of the clusters before exposure to metals provide information about the size and crystallinity of the samples. Size is most easily found from the ultraviolet/visible spectra of the clusters (FIG. 2). The position of the absorption edge depends on size because of quantum confinement. The absorption spectra also give an estimate of the size distribution from the sharpness of the absorption feature (Alivisatos, A.P. et al., *J. Chem. Phys.* (1988) 89: 4001–4011). For the samples prepared in according with this invention, typical size distributions are ±5% on the diameter.

The crystallinity of these clusters before deposition on a surface can be confirmed by both x-ray diffraction and selected area electron diffraction. Direct imaging of the lattice planes by transmission electron microscopy (TEM) shows crystalline spherical particles (FIG. 3).

Characterization of Clusters Bound to Surfaces: After immersion in the cadmium sulfide solutions, the metal/ cluster systems were characterized by contact angle, resonance Raman, XPS, RBS and TEM. A successful coat was indicated by a contact angle between 15–25°. The metals exposed to the cadmium sulfide solutions appeared the same to the eye as plain metal surfaces; in the case of binding carboxylate-coated clusters to aluminum, corrosion would sometimes occur. This could be avoided by keeping the pH near 7.

X-ray photoemission studies of the nanocrystal monolayers indicated the presence of both cadmium and sulfur on the metal surface in a roughly 1:1 ratio. A full survey scan shows the presence of carbon and oxygen as well as cadmium, sulfur and the underlying metal. A small sodium peak, a counterion in the production of the clusters, has also been assigned.

Resonance Raman measurements confirmed the presence of quantum confined clusters on both gold and aluminum surfaces.

Figure 4:
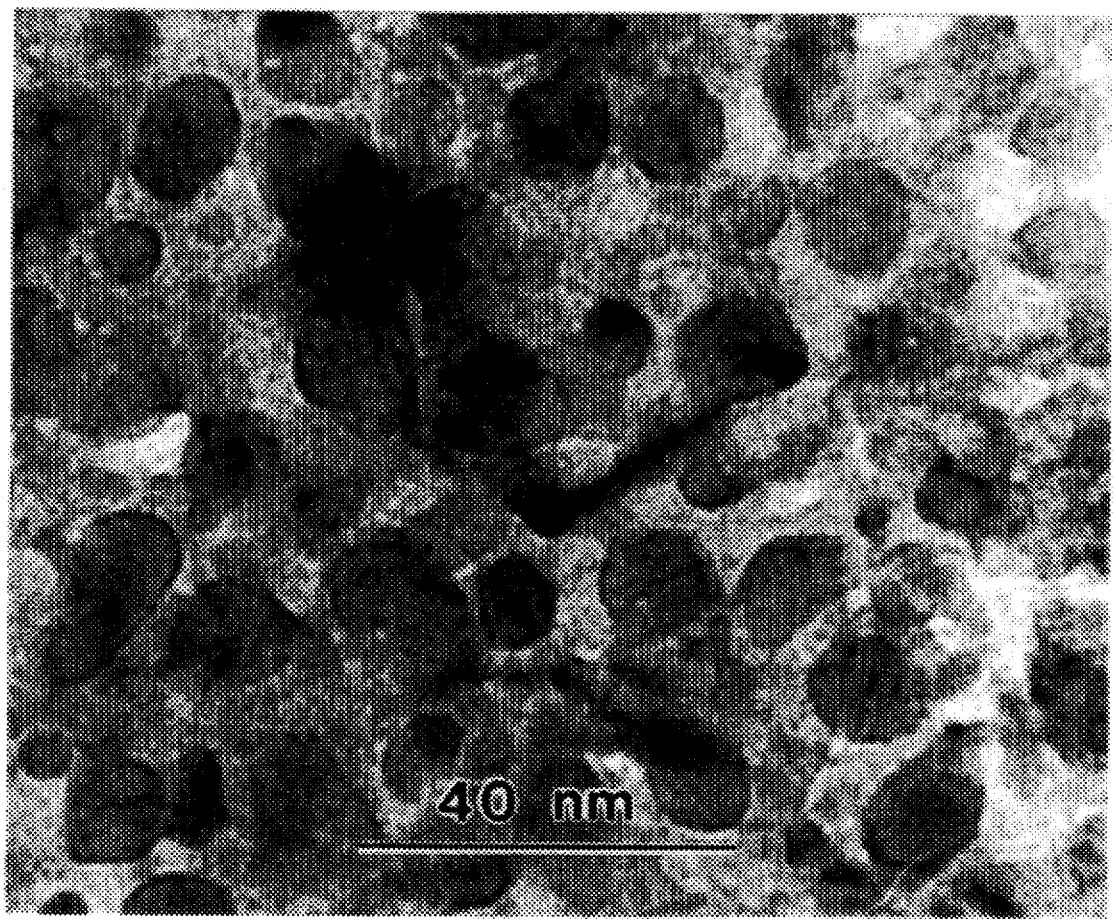
FIG. 4 is a transmission electron micrograph of CdS clusters on aluminum (FIG. 1C). The light mottled background is from the polycrystalline aluminum film while the darker spots are the CdS clusters. The average size of CdS clusters in this sample is 35 Å radius.
Figure 5:
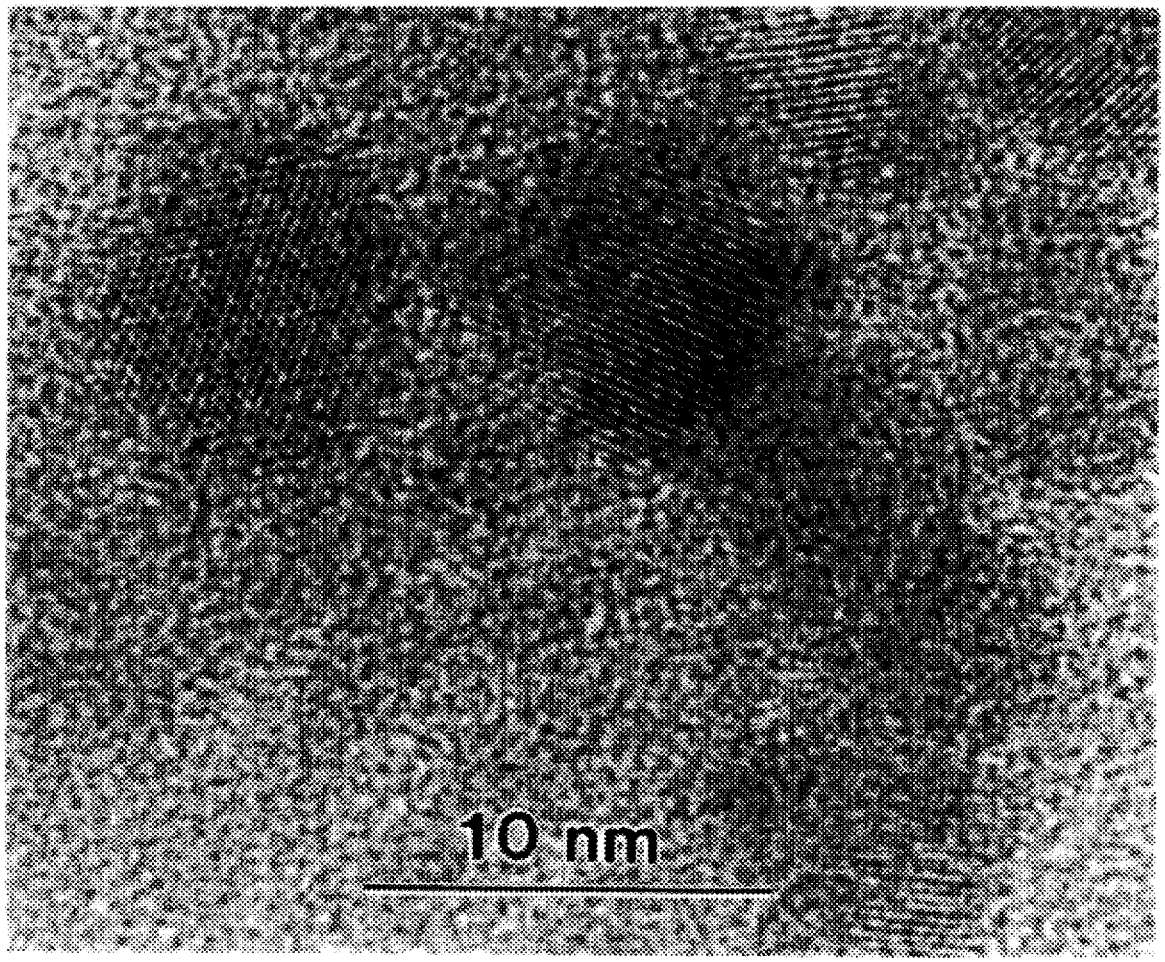
FIG. 5 illustrates single particles of CdS on aluminum. This micrograph shows several clusters magnified so that the lattice planes are visible.

A direct way to probe surface morphology is to use TEM. By using thin (less than 200 Å) films of aluminum for a substrate, TEM images of the actual surface can be obtained (Strong, L. et al., *Langmuir* (1988) 4: 546–558). (Gold samples were not appropriate for this technique, as the heavy gold atoms scatter electrons too strongly.) FIG. 4 shows a large section of a surface of an aluminum sample which was treated with carboxylate-coated clusters. In large areas, the clusters are dispersing homogeneously on the surface; however, blank regions of the film were also imaged. A closer image of these clusters, revealing lattice planes, is shown in FIG. 5. In order to verify that the dark spots were actually crystalline CdS clusters, selected area electron diffraction was performed on the samples.

The evidence from a variety of characterization techniques shows that CdS clusters can be bound to metal surfaces using self-assembled monolayers. The nanocrystals are deposited intact, without fusion or aggregation, but at relatively high coverage. In this form, electron spectroscopies can be performed on the clusters, without any charging. The samples are durable, lasting for months in air without degradation. The general techniques of attaching clusters to metals via an organic bridge is versatile; it is successful whether the bridge group is first attached to the metal or to the nanocrystal. These samples have already proven useful in spectroscopic investigations of semiconductor nanocrystals.

It is seen that the clusters are deposited intact, without fusion or aggregation. XPS data indicates the presence of atomic sulfur and cadmium on treated surfaces (FIGS. 7, 8). Resonance Raman shows that samples prepared by a variety of techniques have modes at 300 and 600 cm$^{-1}$, in agreement with measurements of bulk cadmium sulfide, and cadmium sulfide nanocrystals in solution (FIGS. 11, 12, and 17). Resonance Raman data also indicates that clusters do not fuse on the surfaces of the metal. Previous work has shown that quantum confined clusters, while having spectra similar to bulk CdS, have different overtone ratios, and that the ratio of the fundamental to the overtone increases smoothly with decreasing size. This trend is observed in the metal-bound nanocrystal samples (FIG. 11), as particles of different sizes deposited on metal surfaces show an increase in the ratio of the first LO to the second LO with decreasing size (Shiang, J.J. et al., *J. Chem. Phys.* (1990) 92: 3232–3233). Finally, TEM imaging of thin films of CdS treated aluminum clearly shows the presence of small crystalline clusters whose electron diffraction pattern is consistent with small zincblende CdS clusters (FIGS. 14, 15).

An important parameter in the study of clusters is the size distribution. It is possible that kinetic or thermodynamic factors could favor the binding of one size over another, resulting in a narrower size distribution for bound clusters, compared to the distribution in the solution phase. To investigate this possibility, size distributions before and after deposition were measured using Raman excitation spectra (FIG. 13). Both samples peak at the same wavelength. The coincidence of the resonance Raman excitation spectrum peak with the quantum confined solution phase optical absorption spectrum provides additional confirmation that the particles are deposited intact without aggregation.

Coverage is half a "monolayer." Absolute resonance Raman and Rutherford Back-Scattering measurements yield a coverage near half a monolayer. These methods average over microns, and sampling over different regions of the samples shows that there is little variation in the coverage. Direct transmission electron microscopy measurement of the coverage confirms most aspects of these results. TEM is impossible to perform on the micron-thick metal surfaces on which the clusters are normally deposited, since the metal attenuates the diffracting electron beam. Following Strong, L. et al., supra, this difficulty was overcome by attaching the nanocrystals to a very thin (200 Å or less) film of aluminum, which was floated onto a Cu TEM grid. The images obtained are shown in FIG. 4. The clusters in these photos appear well-dispersed over 500 Å. They are very closely packed and the observed coverage is commensurate with that measured by RBS and Raman. One characteristic of the TEM photos is that not all of the aluminum surface is coated. TEM results on the aluminum surfaces indicate that the clusters bind to the surface without clumping or stacking to form homogeneous layers of 0.5-1 coverage. Given the agreement of all other characterization data of the three kinds of samples, this conclusion also holds for the other two sample types (FIGS. 1A, B).

A number of factors govern the choice of chain length for the bridging moiety such as dithiols. The alkane chain needs to be short enough that looping of the bifunctional bridging moiety does not occur. The metal must be close enough to dissipate charge during photoemission and other electron spectroscopy experiments, but not so close as to alter the energies and densities of the cluster electronic states. Our choice of 7–12 Å chain lengths balances these various factors.

Figure 1C:
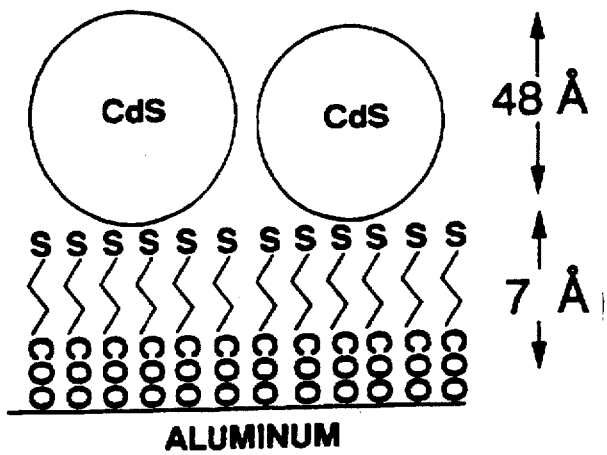

Dithiols and thiol acids with short chains were used to build the initial monolayers. This point deserves comment, since most investigators have used much longer chain hydrocarbons in the preparation of monolayers. Previous studies of SAMs have determined that longer chain molecules, $C_{10}$ or longer, are necessary for the formulation of crystalline monolayers because it is the lateral interactions between long chains which drive the organization of the system (Ulman, A. et al., *Langmuir* (1989) 5: 1147–1152). While such ordered systems have many advantages, they are not called for in this application; a more important parameter is the availability of free thiols to anchor clusters, which was optimized in the gold samples by the use of short-chain dithiols. The short chains were necessary to avoid the problems of dithiols looping on the gold surface as referred to by Bain et al. These species, such as hexane dithiol, cannot bind both ends to the metal without undergoing extensive strain. Contact angle measurements of 1,6-hexane dithiol on gold average between 40–50°, consistent with observed contact angles of free alcohols. Also, the success of these samples in binding cadmium rich clusters indicates the presence of available thiols. For the aluminum samples, thioglycolic acid was used (FIG.1B) so that the surface would be identical to water soluble clusters on aluminum (FIG. 1C). Such a short chain acid would lead to a quite disordered surface, but as before for this application the presence of free thiols close to the metal is far more important.

The clusters bound to metal surfaces using SAMs do not charge up in photoemission experiments. This is clear from comparison of photoemission data on nanocrystals deposited by pressing into metal foils versus the SAM bound samples.

These cluster on surface systems represent a new class of nanocrystal material, well suited for many applications. Although they were designed for application to electronic spectroscopies, Resonance Raman experiments benefit from the reduced fluorescence of the sample. In addition the metal samples are excellent thermal conductors and can be bolted onto the end of cryostats facilitating low temperature studies. The thermal conductivity of the metals can also be exploited for high temperature studies of the clusters. The clusters melt at a reduced temperature and these samples are excellent candidates for the formation of thin films of bulk CdS at low temperatures. These products can be used in semiconductor device applications, as well.

The versatility of the synthetic technique is also an advantage. A change in the bridging group allows the distance from the metal, the type of metal, and the nature of the cluster surface species to be varied. Such direct control over these parameters is crucial for studying electron and energy transport within the nanocrystal monolayer, and from the nanocrystals to the substrate. The study of interaction between nanocrystals is of great interest, since such phenomena will be very important in an ordered, organized assembly of these clusters. The images of the clusters indicate they are packed sufficiently close together (FIG. 4) that dipole-dipole interactions between nanocrystals could influence the optical absorption spectra. As cluster size and surface preparation are made even more uniform, the nanocrystals should pack into two-dimensional arrays.

What is claimed is:

1. A semiconductor assembly comprising:
   a) a solid inorganic substrate surface;
   b) a self-assembled monolayer of heterobifunctional bridging moieties covalently bonded thereto, each of said bridging moieties having two functional groups, with one of said functional groups covalently bonded to said substrate surface; and
   c) semiconductor nanocrystals covalently bonded to said bridging moieties through a second of said two functional groups on each of said bridging moieties.

2. The semiconductor assembly of claim 1 wherein the solid inorganic substrate surface is an oxidic surface.

3. The semiconductor assembly of claim 2 wherein the solid inorganic substrate surface is a silicon oxide surface.

4. The semiconductor assembly of claim 2 wherein the solid inorganic substrate surface is an aluminum oxide surface.

5. The semiconductor assembly of claim 1 wherein the solid inorganic substrate surface is a solid metal substrate surface.

6. The semiconductor assembly of claim 5 wherein the solid metal substrate surface is a solid gold surface.

7. The semiconductor assembly of claim 5 wherein the solid metal substrate surface is a solid aluminum surface.

8. The semiconductor assembly of claim 1 wherein the semiconductor nanocrystals are III–V semiconductors.

9. The semiconductor assembly of claim 1 wherein the semiconductor nanocrystals are II–VI semiconductors.

10. The semiconductor assembly of claim 1 wherein the semiconductor is CdS.

11. The semiconductor assembly of claim 1 wherein the semiconductor is CdSe.

12. The semiconductor assembly of claim 1 wherein the semiconductor is ZnS.

13. The semiconductor assembly of claim 1 wherein the semiconductor is ZnSe.

14. The semiconductor assembly of claim 1 wherein the semiconductor is GaAs.

15. The semiconductor assembly of claim 1 wherein the semiconductor is InAs.

16. The semiconductor assembly of claim 1 wherein the semiconductor is GaP.

17. A semiconductor assembly comprising:
   a) semiconductor nanocrystals;
   b) one or more bridging moieties, each comprising an organic molecule having at least two functional groups and from 4 to 8 carbons between said functional groups, covalently bonded to said semiconductor nanocrystals through one of said least two functional groups; and
   c) a surface covalently bonded to said one or more bridging moieties through another of said at least two functional groups on said bridging moieties.

18. The semiconductor assembly of claim 17 wherein each of said one or more bridging moieties comprises a dithiol having the formula H—S—R—S—H, wherein R is an organic group having from 4 to 8 carbons.

19. The semiconductor assembly of claim 17 wherein each of said one or more bridging moieties comprises a difunctional molecule having a thiol group and a carboxyl group.

20. The semiconductor assembly of claim 17 wherein said surface comprises a solid surface of a material selected from the group consisting of silicon oxide, aluminum oxide, and a metal.

21. The semiconductor assembly of claim 17 wherein said semiconductor nanocrystals are III–V semiconductors.

22. The semiconductor assembly of claim 17 wherein said semiconductor nanocrystals are II–VI semiconductors.

23. A semiconductor assembly comprising:
   a) semiconductor nanocrystals;
   b) a monolayer comprising a plurality of organic bridging moieties, each having at least two functional groups spaced apart by from 4 to 8 carbon atoms, and covalently bonded to said semiconductor nanocrystals through one of said at least two functional groups; and
   c) a solid support surface covalently bonded to said monolayer of organic bridging moieties through another of said at least two or more functional groups on each of said plurality of bridging moieties comprising said monolayer.

24. The semiconductor assembly of claim 23 wherein each of said organic bridging moieties comprises a dithiol.

25. The semiconductor assembly of claim 23 wherein each of said organic bridging moieties comprises a difunctional molecule having a thiol group and a carboxyl group.

26. A semiconductor assembly comprising:
   a) a solid inorganic substrate surface;
   b) a self-assembled monolayer of homobifunctional bridging moieties covalently bonded thereto, each of said bridging moieties having two functional groups, with one of said functional groups covalently bonded to said substrate surface; and c) semiconductor nanocrystals covalently bonded to said bridging moieties through a second of said two functional groups on each of said bridging moieties.

27. The semiconductor assembly of claim 26 wherein the solid inorganic substrate surface is an oxidic surface.

28. The semiconductor assembly of claim 27 wherein the solid inorganic substrate surface is a silicon oxide surface.

29. The semiconductor assembly of claim 27 wherein the solid inorganic substrate surface is an aluminum oxide surface.

30. The semiconductor assembly of claim 26 wherein the solid inorganic substrate surface is a solid metal surface.

31. The semiconductor assembly of claim 30 wherein the solid inorganic substrate surface is a solid gold surface.

32. The semiconductor assembly of claim 30 wherein the solid metal substrate surface is a solid aluminum surface.

33. The semiconductor assembly of claim 26 wherein the semiconductor nanocrystals are III–V semiconductors.

34. The semiconductor assembly of claim 26 wherein the semiconductor nanocrystals are II–VI semiconductors.

35. The semiconductor assembly of claim 26 wherein the semiconductor is CdS.

36. The semiconductor assembly of claim 26 wherein the semiconductor is CdSe.

37. The semiconductor assembly of claim 26 wherein the semiconductor is ZnS.

38. The semiconductor assembly of claim 26 wherein the semiconductor is ZnSe.

39. The semiconductor assembly of claim 26 wherein the semiconductor is GaAs.

40. The semiconductor assembly of claim 26 wherein the semiconductor is InAs.

41. The semiconductor assembly of claim 26 wherein the semiconductor is GaP.

* * * * *